US009904009B2

(12) United States Patent
Leobandung

(10) Patent No.: US 9,904,009 B2
(45) Date of Patent: *Feb. 27, 2018

(54) ELECTRICAL AND OPTICAL THROUGH-SILICON-VIA (TSV)

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 203 days.

This patent is subject to a terminal disclaimer.

(21) Appl. No.: 14/879,129

(22) Filed: Oct. 9, 2015

(65) Prior Publication Data

US 2016/0116672 A1   Apr. 28, 2016

Related U.S. Application Data

(63) Continuation of application No. 14/524,333, filed on Oct. 27, 2014, now Pat. No. 9,236,328.

(51) Int. Cl.
G02B 6/12 (2006.01)
H01L 23/48 (2006.01)
(Continued)

(52) U.S. Cl.
CPC ......... *G02B 6/12002* (2013.01); *G02B 6/132* (2013.01); *G02B 6/136* (2013.01);
(Continued)

(58) Field of Classification Search
CPC ..... H01L 21/76898; H01L 2225/06541; H01L 2225/06544; H01L 25/655; H01L 25/657
See application file for complete search history.

(56) References Cited

U.S. PATENT DOCUMENTS 6,790,775 B2 * 9/2004 Fartash ............ H01L 21/76898
257/621
6,996,305 B2   2/2006 Kim et al.
(Continued)

FOREIGN PATENT DOCUMENTS

JP    2013222095 A    10/2013
WO    2013166021 A1   11/2013

OTHER PUBLICATIONS

Chen et al., "Fine-pitch Backside Via-last TSV Process with Optimization on Temporary Glue and Bonding Conditions", 2013 IEEE Electronic Components & Technology Conference, pp. 1811-1814.
(Continued)

*Primary Examiner* — Karen Kusumakar
(74) *Attorney, Agent, or Firm* — L. Jeffrey Kelly

(57) ABSTRACT

A through-silicon-via structure formed within a semiconductor device is provided. The TSV structure may include a trench located within a substrate of the semiconductor device, an insulator layer located on at least one side wall of the trench, an electrically conductive layer located on the insulator layer, a first dielectric layer located on the electrically conductive layer, and a second dielectric layer located on the first dielectric layer and filling the trench. The second dielectric layer includes a higher refractive index relative to the first dielectric layer, such that the first and the second dielectric layer create an optical waveguide. The electrically conductive layer provides electrical coupling between the semiconductor device and another semiconductor device, while the optical waveguide provides optical coupling between the semiconductor device and the another semiconductor device, whereby the another semiconductor device has another substrate that is separate from the substrate of the semiconductor device.

20 Claims, 10 Drawing Sheets

(51) Int. Cl.
*H01L 21/768* (2006.01)
*G02B 6/43* (2006.01)
*G02B 6/132* (2006.01)
*G02B 6/136* (2006.01)
*H01L 25/065* (2006.01)
*H01L 25/00* (2006.01)

(52) U.S. Cl.
CPC .......... *G02B 6/43* (2013.01); *H01L 21/76834* (2013.01); *H01L 21/76898* (2013.01); *H01L 23/481* (2013.01); *H01L 25/0657* (2013.01); *H01L 25/50* (2013.01); *G02B 2006/12176* (2013.01); *H01L 2224/16145* (2013.01); *H01L 2225/06541* (2013.01); *H01L 2225/06544* (2013.01)

(56) References Cited

U.S. PATENT DOCUMENTS

| | | |
|---|---|---|
| 7,352,066 B2 | 4/2008 | Budd et al. |
| 8,541,884 B2 | 9/2013 | Conn et al. |
| 2006/0113598 A1* | 6/2006 | Chen ................. H01L 21/76898 257/347 |
| 2007/0085215 A1 | 4/2007 | Budd et al. |
| 2010/0322551 A1 | 12/2010 | Budd et al. |
| 2013/0108211 A1 | 5/2013 | Kwok et al. |
| 2014/0177626 A1* | 6/2014 | Thottethodi .......... H04L 45/021 370/351 |

OTHER PUBLICATIONS

Pending U.S. Appl. No. 14/524,333, filed Oct. 27, 2014, entitled: "Electrical and Optical Through-Silicon-Via (TSV)", 34 pages.

\* cited by examiner

ELECTRICAL AND OPTICAL THROUGH-SILICON-VIA (TSV)

BACKGROUND

The present invention generally relates to semiconductor devices, and more particularly, to through-silicon-via (TSV) structures located within such semiconductor devices.

TSVs may, among other things, be used to provide an electrical connection from one semiconductor chip to another semiconductor chip in a three-dimensional (3D) integration. Within a semiconductor chip, a conventional TSV structure may typically involve forming a trench, creating a liner over the walls of the trench, and subsequently filling the lined trench, for example, entirely with copper (Cu). Other TSV device structures such as optical TSVs may alternatively provide an optical connection between the semiconductor chips in the 3D integration. Thus, based on application, some semiconductor device may utilize both optical and electrical TSV structures.

BRIEF SUMMARY

According to one or more embodiments, an integrated optical and electrical TSV structure formed within the same opening or trench of a semiconductor device may be provided. One or more optically and electrically conductive materials may be fabricated within the trench or formed opening to facilitate, for example, both optical and electrical coupling between the semiconductor device and at least one other semiconductor device or structure associated with, for example, a 3D integration.

According to one exemplary embodiment, a through-silicon-via (TSV) structure formed within a semiconductor device is provided. The TSV structure includes a trench located within a substrate region of the semiconductor device, an insulator layer located on at least one side wall of the trench, an electrically conductive layer located on the insulator layer, a first dielectric layer located on the electrically conductive layer, and a second dielectric layer located on the first dielectric layer and filling the trench. The second dielectric layer has a higher refractive index relative to the first dielectric layer, whereby the first and the second dielectric layer create an optical waveguide structure. The electrically conductive layer provides electrical coupling between the semiconductor device and another semiconductor device, while the optical waveguide structure accordingly provides optical coupling between the semiconductor device and the another semiconductor device.

According to another exemplary embodiment, a method of forming a through-silicon-via (TSV) structure within a semiconductor device is provided. The method includes etching a trench within a substrate region of the semiconductor device, depositing an insulator layer on at least one side wall of the trench, depositing an electrically conductive layer on the insulator layer, depositing a first dielectric layer on the electrically conductive layer, and depositing a second dielectric layer on the first dielectric layer and filling the trench. The deposited second dielectric layer has a higher refractive index relative to the deposited first dielectric layer, whereby the deposited first and the deposited second dielectric layer form an optical waveguide structure. The electrically conductive layer provides electrical coupling between the semiconductor device and another semiconductor device, while the optical waveguide structure provides optical coupling between the semiconductor device and the another semiconductor device.

According to another exemplary embodiment, a design structure tangibly embodied in a machine readable medium for designing, manufacturing, or testing an integrated circuit is provided. The design structure includes a trench located within a substrate region of the semiconductor device, an insulator layer located on at least one side wall of the trench, an electrically conductive layer located on the insulator layer, a first dielectric layer located on the electrically conductive layer, and a second dielectric layer located on the first dielectric layer and filling the trench. The second dielectric layer has a higher refractive index relative to the first dielectric layer, whereby the first and the second dielectric layer create an optical waveguide structure. The electrically conductive layer provides electrical coupling between the semiconductor device and another semiconductor device, while the optical waveguide structure accordingly provides optical coupling between the semiconductor device and the another semiconductor device.

According to yet another exemplary embodiment, a through-silicon-via (TSV) structure formed within a semiconductor device is provided. The TSV structure includes a substantially circular trench located within a substrate region of the semiconductor device and an insulator layer located on a sidewall of the substantially circular trench. An electrically conductive layer is located on the insulator layer, whereby the electrically conductive layer creates an electrical waveguide structure in an outer concentric region of the substantially circular trench. A first dielectric layer is located on the electrically conductive layer, while a second dielectric layer is located on the first dielectric layer and fills the trench. The second dielectric layer has a higher refractive index relative to the first dielectric layer, whereby the first and the second dielectric layer creates an optical waveguide structure within an inner concentric region of the substantially circular trench. The electrical waveguide structure and the optical waveguide structure share a concentric axis associated with the substantially circular trench.

BRIEF DESCRIPTION OF THE SEVERAL VIEWS OF THE DRAWINGS

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

The following exemplary embodiments describe, among other things, an integrated optical and electrical TSV structure formed within the same opening or trench of a semiconductor device (i.e., a semiconductor chip). One or more optically and electrically conductive materials may be fabricated within the trench or formed opening to facilitate, for example, both optical (i.e., optical signal transmission) and electrical (i.e., power supply or electrical signal transmission) coupling between the semiconductor device and another semiconductor device (i.e., another semiconductor chip) or structure associated with, for example, a 3D integration including two (2) stacked chips.

Figure 1:
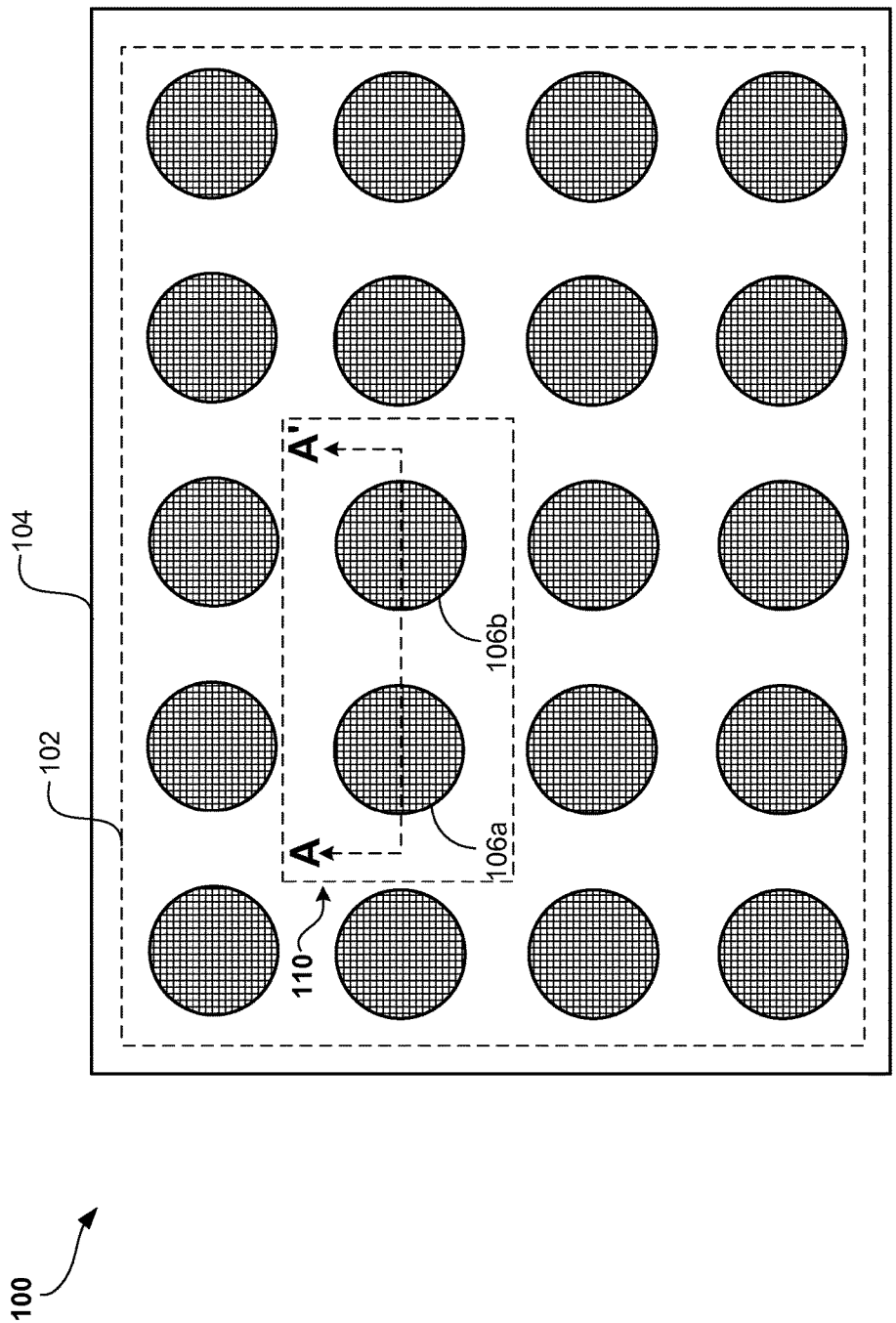
FIG. 1 is a bottom view of a semiconductor device having an array of trenches used to form TSV structures, according to one exemplary embodiment.

Referring to FIG. 1, a bottom view of a semiconductor device 100 illustrates the formation of an array of trenches 102 or openings within a substrate region 104 of the semiconductor device 100. For illustrative brevity, the following figures (i.e., FIGS. 2-6) refer to the formation of TSV structures within trenches 106a and 106b, which are located in region 110 of semiconductor device 100. These figures (i.e., FIGS. 2-6) illustrate cross-sectional views taken along axis A-A' of trenches 106a and 106b.

Figure 2:
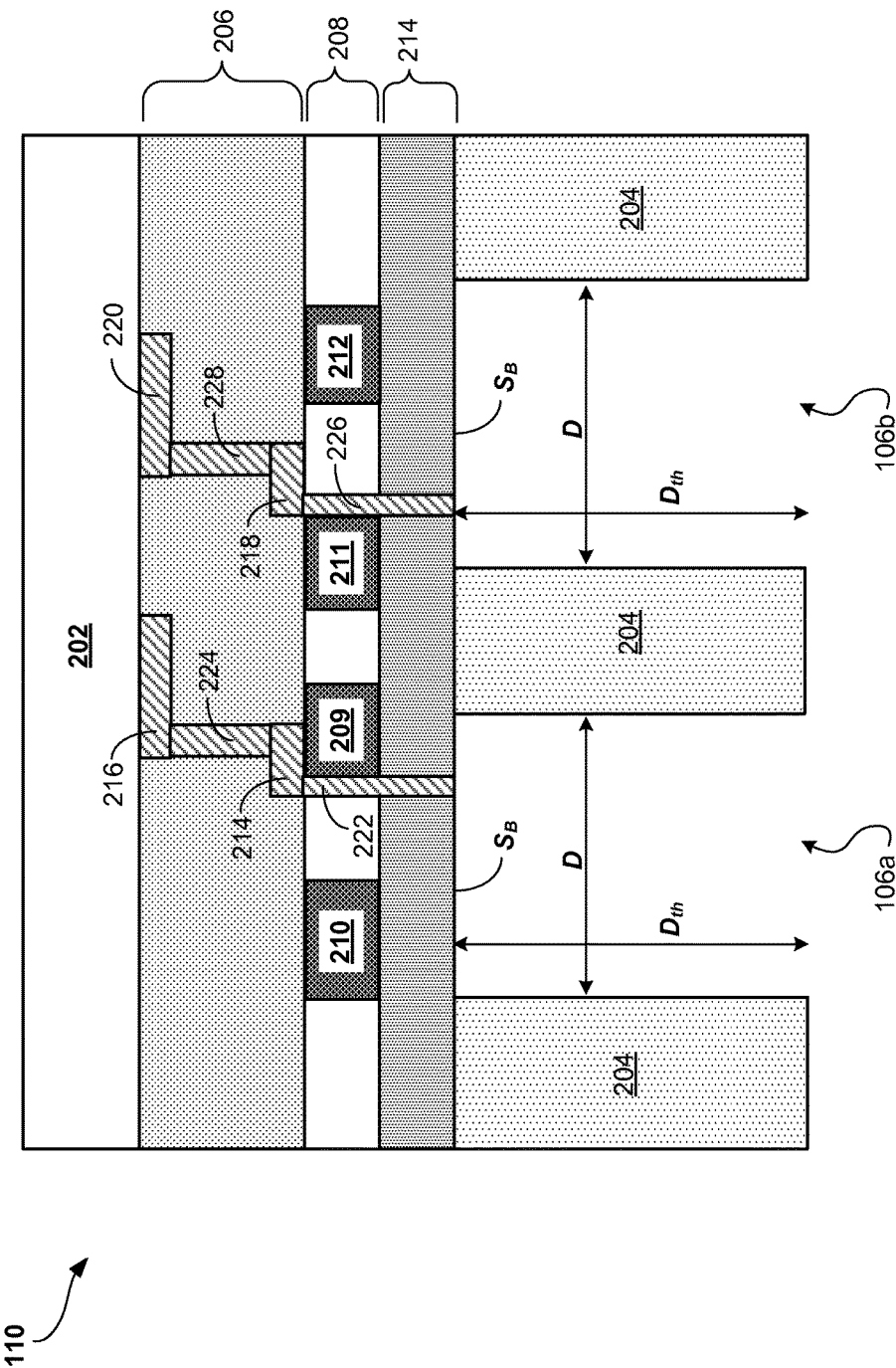
FIG. 2 illustrates a cross-sectional view of a region of the semiconductor device of FIG. 1, whereby TSV trenches are etched into a substrate region, according to one exemplary embodiment.

FIG. 2 illustrates a cross-sectional view of region 110 (FIG. 1) taken along axis A-A' (FIG. 1). Accordingly, the cross-sectional view of region 110 within semiconductor device 100 (FIG. 1) includes a back-end-of-the-line (BEOL) region 206 having metallization layers for providing electrical connectivity (i.e., wiring), a front-end-of-the-line (FEOL) region 208 having optical devices such as optical transceivers 210, 212 and electrical devices such as transistors 209, 211, a buried oxide (BOX) region 214, and trenches 106a and 106b. The devices (e.g., optical transceivers 210, 212; transistor devices 209, 211, etc.) within the FEOL region 208 may be interconnected using the electrical connections (i.e., wiring) facilitated by the BEOL region's 206 metal layers (e.g., electrical connections 214-220, etc.) and via connections (e.g., vias 222-228, etc.).

Trenches 106a and 106b may be formed by photolithographically patterning and etching (e.g., Reactive Ion Etching—RIE) into substrate region 104 (FIG. 1). The trenches 106a, 106b of region 110 may, for example, be etched by securing semiconductor device 100 (FIG. 1), and therefore region 110, to a temporary wafer carrier 202, and subsequently utilizing a standard backside via-last TSV processing technique. Accordingly, the back-end-of-the-line (BEOL) region 206 (wafer top) may be attached to the wafer carrier 202. Trenches 106a and 106b may be etched selective to the BOX region 214. Thus, the bottom of the trenches 106a, 106b may coincide with the bottom surface $S_B$ of the BOX region 214. The trenches 106a, 106b may include a depth $D_{th}$ of about 10-500 microns (μm) and a diameter D of about 0.5-10 μm.

Trench 106a may be aligned to exchange both optical signals associated with transceiver 210 and electrical signals corresponding to transistor 209. Similarly, trench 106b may be aligned to exchange both optical signals associated with transceiver 212 and electrical signals corresponding to transistor 211.

Figure 3:
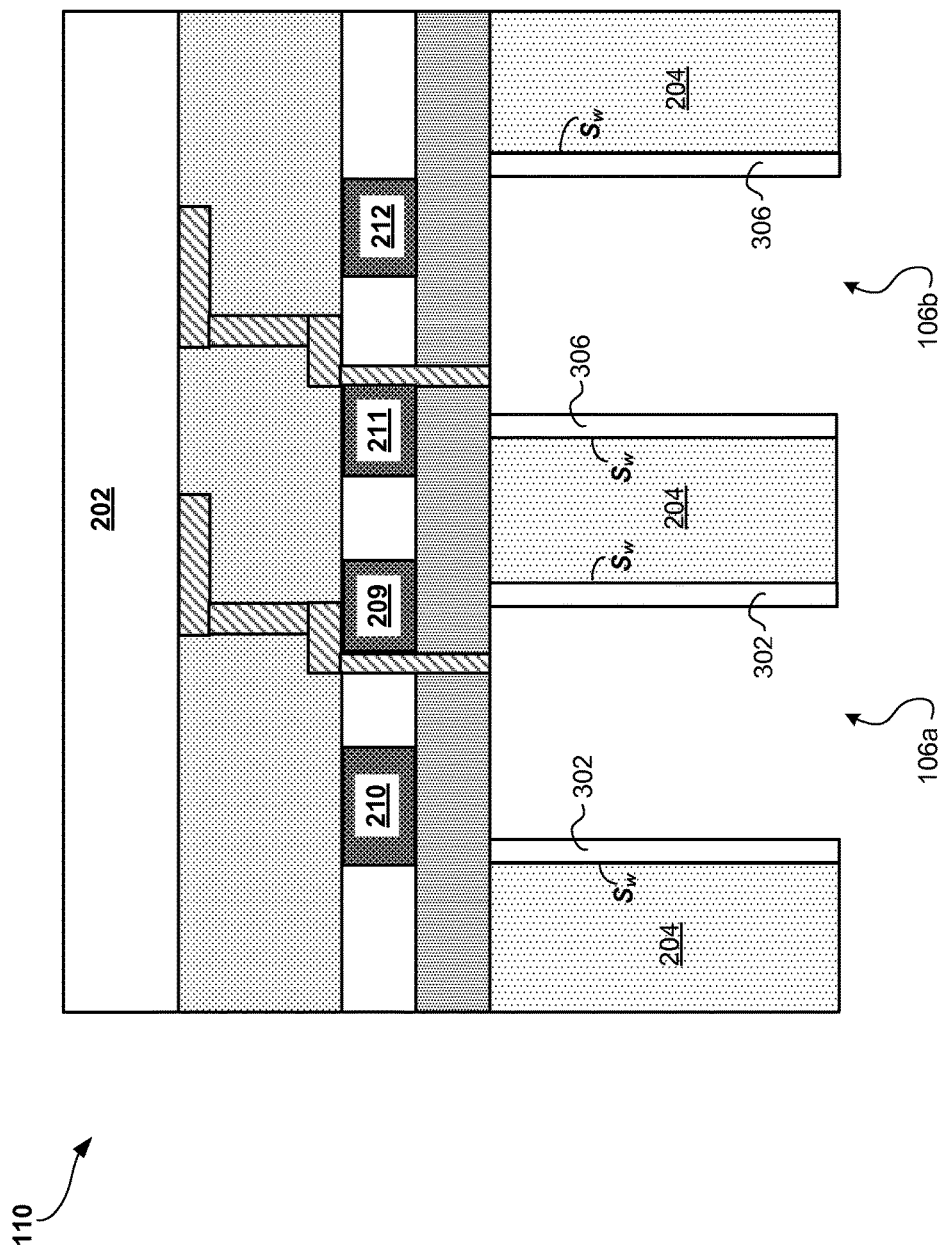
FIG. 3 illustrates a cross-sectional view of the etched trenches, whereby insulator layers are formed in the etched trenches depicted in FIG. 2, according to one exemplary embodiment.

FIG. 3 illustrates a cross-sectional view of region 110, whereby insulator layers 302 and 306 (i.e., insulator spacers) are formed over the sidewalls $S_w$ of trenches 106a and 106b, respectively. As depicted, the sidewalls $S_w$ of trenches 106a and 106b are formed by the sidewalls of etched substrate region 204. In particular, an oxide (e.g., silicon dioxide) or nitride (e.g., silicon nitride) type material having a thickness of about 0.1-1.0 μm may be deposited on the sidewalls $S_w$ of the trenches 106a, 106b to form insulator layers 302 and 306. The insulator layers 302, 306 may be deposited using any Chemical Vapor Deposition (CVD) technique such as, but not limited to, an Atomic Layer Deposition (ALD) process or a plasma enhanced chemical vapor deposition (PECVD) process. The insulator layers 302, 306 may act as a buffer to provide electrical insulation between any subsequently formed electrically conductive materials within the trenches 106a, 106b and the etched substrate region 204.

It may be appreciated that since the profile of depicted trenches 106a and 106b are substantially circular in shape, each of these trenches 106a, 106b has a single sidewall (i.e., $S_w$). In an alternative exemplary embodiment, however, the profile of the trenches 106a, 106b may include multiple sidewalls. For example, for a rectangular shaped profile, the trenches will each include four sidewalls.

Figure 4:
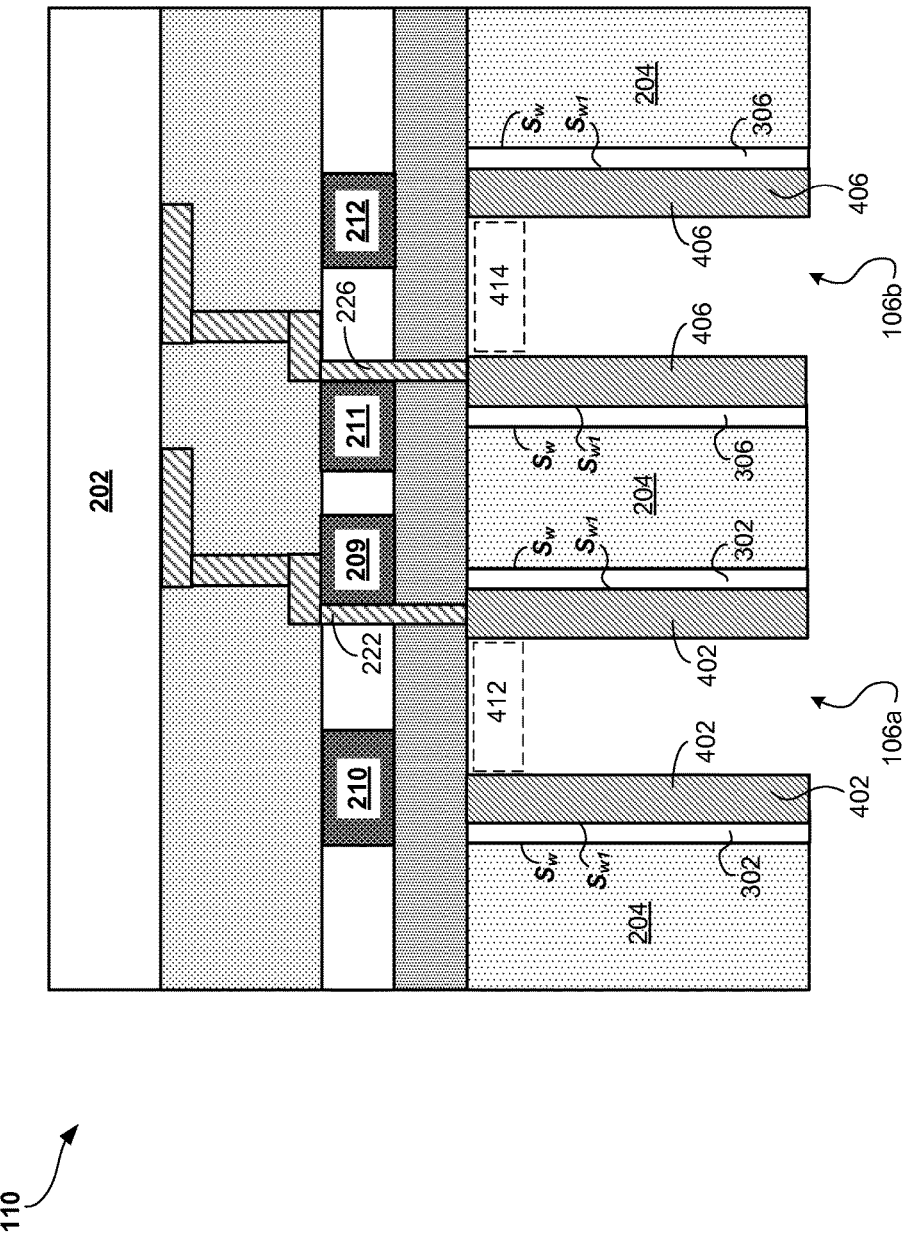
FIG. 4 illustrates a cross-sectional view of the etched trenches, whereby electrically conductive layers are formed over the insulator layers depicted in FIG. 3, according to one exemplary embodiment.

FIG. 4 illustrates a cross-sectional view of region 110, whereby electrically conductive layers 402 and 406 (i.e., conductive spacers) are formed over the sidewalls $S_{w1}$ of respective insulator layers 302 and 306. More specifically, electrically conductive layer 402 may be formed over the sidewall $S_{w1}$ of insulator layer 302 using, for example, a copper (Cu) electroplating process. During the electroplating process, copper material is also deposited along the base region 412 of trench 106a. However, a subsequent RIE process may be used to remove the copper from base region 412. Thus, as depicted, electrically conductive layer 402 is formed over the sidewall $S_{w1}$ of insulator layer 302. Similarly, electrically conductive layer 406 may be formed over the sidewall $S_{w1}$ of insulator layer 306 using, for example, a copper (Cu) electroplating process. During the electroplating process, copper material is also deposited along the base region 414 of trench 106b. However, as previously described, a subsequent RIE process may be used to remove the copper from base region 414. Thus, as depicted, electrically conductive layer 406 is formed over the sidewall $S_{w1}$ of insulator layer 306. The electrically conductive layers 402, 406 (i.e., conductive spacers) may include a thickness of about 1-10 μm, although greater or lesser thicknesses may be contemplated based on the diameter and depth of the trenches 106a, 106b. It may also be appreciated that other high electrical conductivity materials (e.g., gold) may be utilized instead of copper.

As illustrated in FIG. 4, electrically conductive layer 402 is substantially aligned with and electrically coupled to electrically conductive via connection 222. In operation, this allows electrical signals (AC or DC) to be electrically coupled from electrically conductive via connection 222 to electrically conductive layer 402. As will be described in the following paragraphs, these electrical signals received from electrically conductive via connection 222 may be sent by conductive layer 402 to another semiconductor device (i.e., a separated chip) that is coupled to semiconductor device 100 (FIG. 1). Similarly, electrically conductive layer 406 is substantially aligned with and electrically coupled to electrically conductive via connection 226. In operation, this allows electrical signals (AC or DC) to be electrically coupled from electrically conductive via connection 226 to electrically conductive layer 406. As will be described in the following paragraphs, these electrical signals received from electrically conductive via connection 226 may be sent by conductive layer 406 to another semiconductor device (i.e., a separated chip) that is coupled to semiconductor device 100 (FIG. 1).

Figure 5:
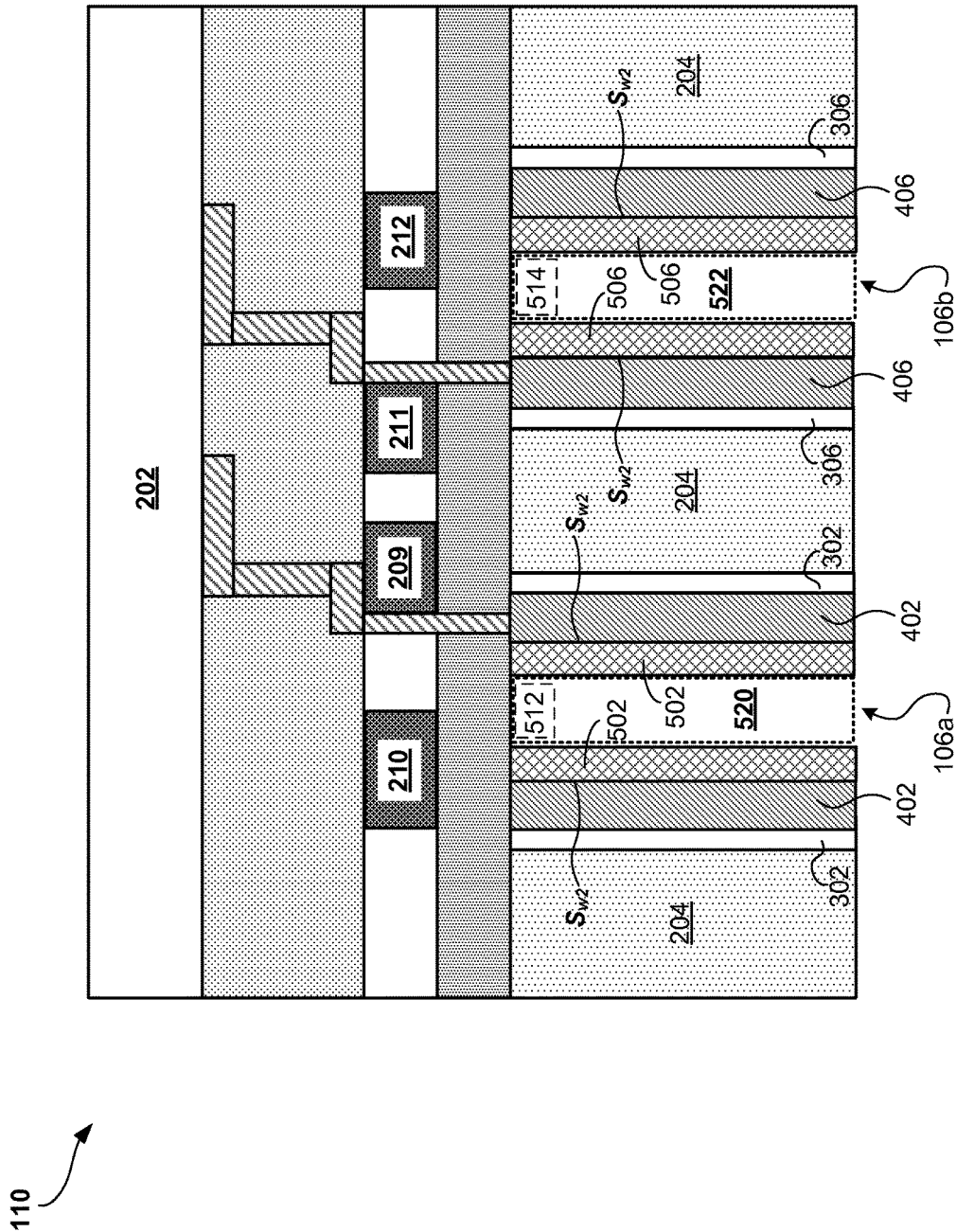
FIG. 5 illustrates a cross-sectional view of the etched trenches, whereby first dielectric layers are formed over the electrically conductive layers depicted in FIG. 4, according to one exemplary embodiment.

FIG. 5 illustrates a cross-sectional view of region 110, whereby dielectric layers 502 and 506 are formed over the sidewalls $S_{w2}$ of respective electrically conductive layers 402 and 406. More specifically, dielectric layer 502 may be formed over the sidewall $S_{w2}$ of electrically conductive layer 402 using, for example, a CVD process. During the CVD process, dielectric material is also deposited along the base region 512 of trench 106a. However, a subsequent RIE process may be used to remove the dielectric from base region 512. Thus, as depicted, dielectric layer 502 is formed over the sidewall $S_{w2}$ of electrically conductive layer 402. Similarly, dielectric layer 506 may be formed over the sidewall $S_{w2}$ of electrically conductive layer 406 using, for example, a CVD process. During the CVD process (e.g., ALD, PECVD, etc.), dielectric material is also deposited along the base region 514 of trench 106b. However, as previously described, a subsequent RIE process may be used to remove the dielectric from base region 514. Thus, as depicted, dielectric layer 506 is formed over the sidewall $S_{w2}$ of electrically conductive layer 406. The dielectric layers 502, 506 may each include a thickness of about 1-2 μm, although greater or lesser thicknesses may be contemplated based on, for example, the diameter and depth of the trenches 106a, 106b. Dielectric layers 502 and 506 may include an oxide material (e.g., silicon dioxide).

Figure 6:
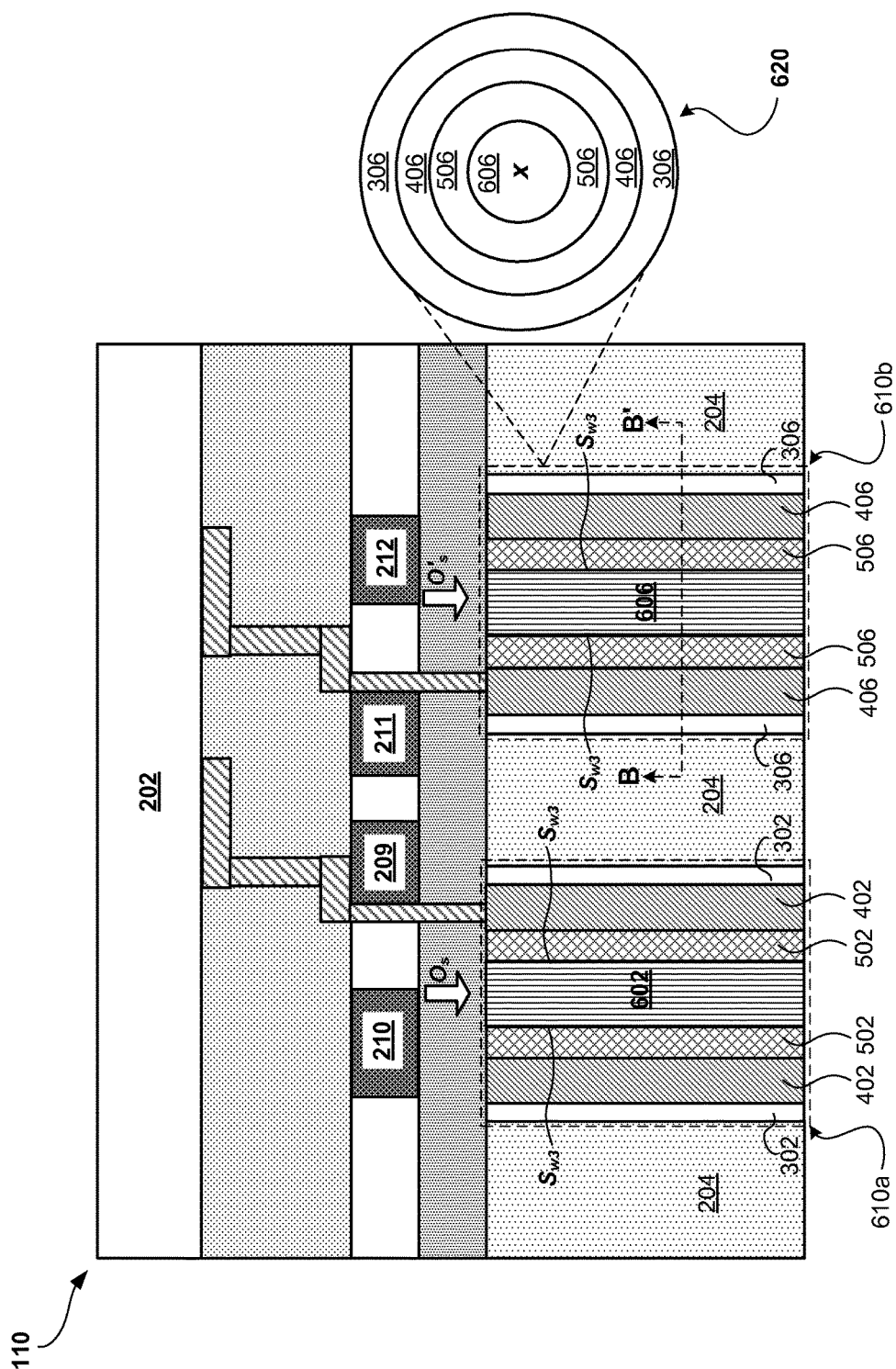
FIG. 6 illustrates a cross-sectional view of optical/electrical TSV structures formed within the etched trenches, whereby second dielectric layers fill remaining openings within the trenches and are formed over the first dielectric layers depicted in FIG. 5, according to one exemplary embodiment.

FIG. 6 illustrates a cross-sectional view of region 110, whereby dielectric layers 602 and 606 are formed over the sidewalls $S_{w3}$ of respective dielectric layers 502 and 506. As depicted, dielectric layers 602 and 606 also fill respective openings 520 (FIG. 5) and 522 (FIG. 5) of the trenches 106a, 106b (FIG. 5). More specifically, dielectric layer 602 may be formed over the sidewall $S_{w3}$ of dielectric layer 502 and fill opening 520 (FIG. 5) of trench 106a (FIG. 5) using, for example, a CVD process. Similarly, dielectric layer 606 may be formed over the sidewall $S_{w3}$ of dielectric layer 506 and fill opening 522 (FIG. 5) of trench 106b (FIG. 5) using, for example, a spin on process or CVD process. The dielectric layers 602, 606 may each include a thickness of about 1-10 μm, although greater or lesser thicknesses may be contemplated based on, for example, the diameter and depth of the trenches 106a (FIG. 5), 106b (FIG. 5). Dielectric layers 602 and 606 may include a nitride material (e.g., silicon nitride) or polymer.

Insulator layer 302, electrically conductive layer 402, dielectric layer 502, and dielectric layer 602 create a combined optical and electrical TSV structure 610a, whereby electrically conductive layer 402 forms an electrical waveguide structure and dielectric layers 502 and 602 form an optical waveguide structure. Within the optical waveguide structure, dielectric layer 502 includes a lower refractive index relative to dielectric layer 602. For example, the refractive index ratio of dielectric layer 602 relative to dielectric layer 502 may be about 1.5-5.0. Accordingly, dielectric layer 502 may function as the cladding of the optical waveguide, while the higher refractive index dielectric layer 602 functions as the optical waveguide's core. Thus, in operation, an optical signal $O_s$ generated from transceiver 210 is guided within dielectric layer 602, which functions as the waveguide's core.

Similarly, insulator layer 306, electrically conductive layer 406, dielectric layer 506, and dielectric layer 606 create a combined optical and electrical TSV 610b, whereby electrically conductive layer 406 forms an electrical waveguide structure and dielectric layers 506 and 606 form an optical waveguide structure. Within the optical waveguide structure, dielectric layer 506 includes a lower refractive index relative to dielectric layer 606. For example, the refractive index ratio of dielectric layer 606 relative to dielectric layer 506 may be about 1.5-5.0. Accordingly, dielectric layer 506 may function as the cladding of the optical waveguide, while the higher refractive index dielectric layer 606 functions as the optical waveguide's core. Thus, in operation, an optical signal $O'_s$ generated from transceiver 212 is guided within dielectric layer 606, which functions as the waveguide's core.

A cross-sectional view of TSV structure 610b taken across axis B-B' illustrates the concentric structure 620 of the waveguides associated with TSV structure 610b. As depicted by concentric structure 620, each of the layers 306, 406, 506, 606 corresponding to the TSV structure 610b are concentric and share a concentric axis, as defined at x, that passes substantially through the center of layer 606. The concentric axis, as defined by x, may be the concentric axis of the trench 610b. The electrical waveguide structure formed by electrically conductive layer 406 is located in the outer concentric region (i.e., further from concentric axis x) of structure 620, while the dielectric layers 506, 606 of the optical waveguide structure are located in the inner concentric region (i.e., closer to concentric axis x relative to the outer concentric region). Although the illustrated embodiment includes a substantially circular trench profile (also see FIG. 1), other profile shapes having a concentric axis may be contemplated. For example, a rectangular trench profile may still include a similar concentric structure to that described in relation to TSV structure 610b. TSV structure 610a includes a substantially identical concentric structure to that of TSV structure 610b. For illustrative brevity, the concentric structure of TSV structure 610a has not been shown.

Figure 7:
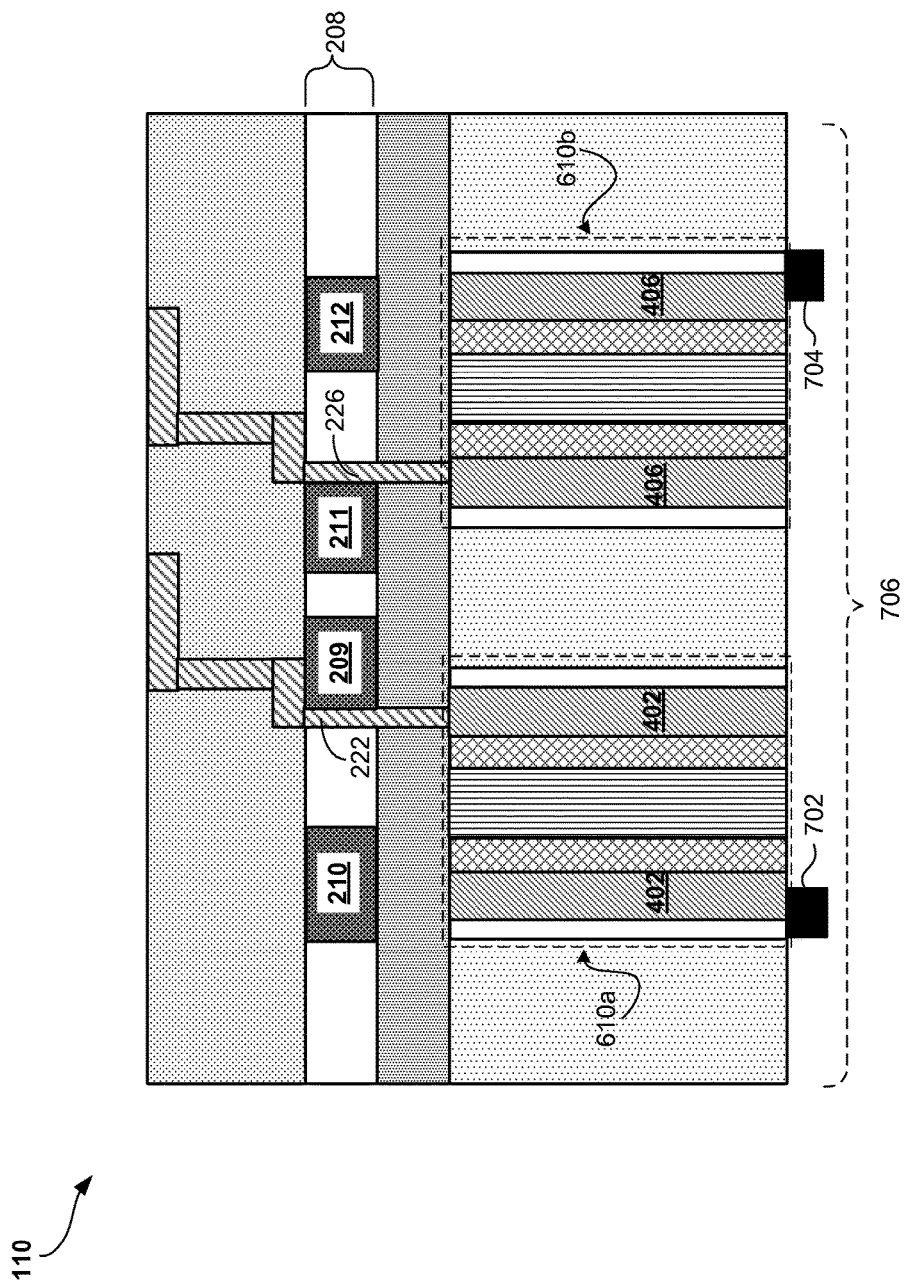
FIG. 7 illustrates a cross-sectional view of the optical/electrical TSV structures of FIG. 6, whereby electrical contacts are formed, according to one exemplary embodiment.

FIG. 7 illustrates a cross-sectional view of region 110, whereby electrical contacts 702 and 704 are coupled to respective electrically conductive layers 402 and 406. More specifically, as depicted, an electrical contact 702 may be formed on wafer bottom portion 706 in order to establish an electrical connection with the electrically conductive layer 402 of TSV structure 610a. For example, via connection 222 may electrically couple transistor device 209 to electrically conductive layer 402. Since electrical contact 702 is coupled to electrically conductive layer 402, the electrical output of transistor 209 may be coupled to any device or conductive path that is electrically coupled to contact 702. Thus, electrically conductive layer 402 provides an electrical connection between transistor 209 of the FEOL region 208 and the electrical contact 702.

Similarly, as depicted, an electrical contact 704 may also be formed on the wafer bottom portion 706 in order to establish an electrical connection with the electrically conductive layer 406 of TSV structure 610b. For example, via connection 226 may electrically couple transistor device 211 to electrically conductive layer 406. Since electrical contact 704 is coupled to electrically conductive layer 406, the electrical output of transistor 211 may be coupled to any device or conductive path that is electrically coupled to contact 704. Thus, electrically conductive layer 406 provides an electrical connection between transistor 211 of the FEOL region 208 and electrical contact 704. Electrical contacts 702 and 704 include any electrically conductive material such as copper, aluminum, gold, metal alloys, etc. In addition, as shown, the temporary wafer carrier 202 (FIG. 6) is also removed.

Figure 8:
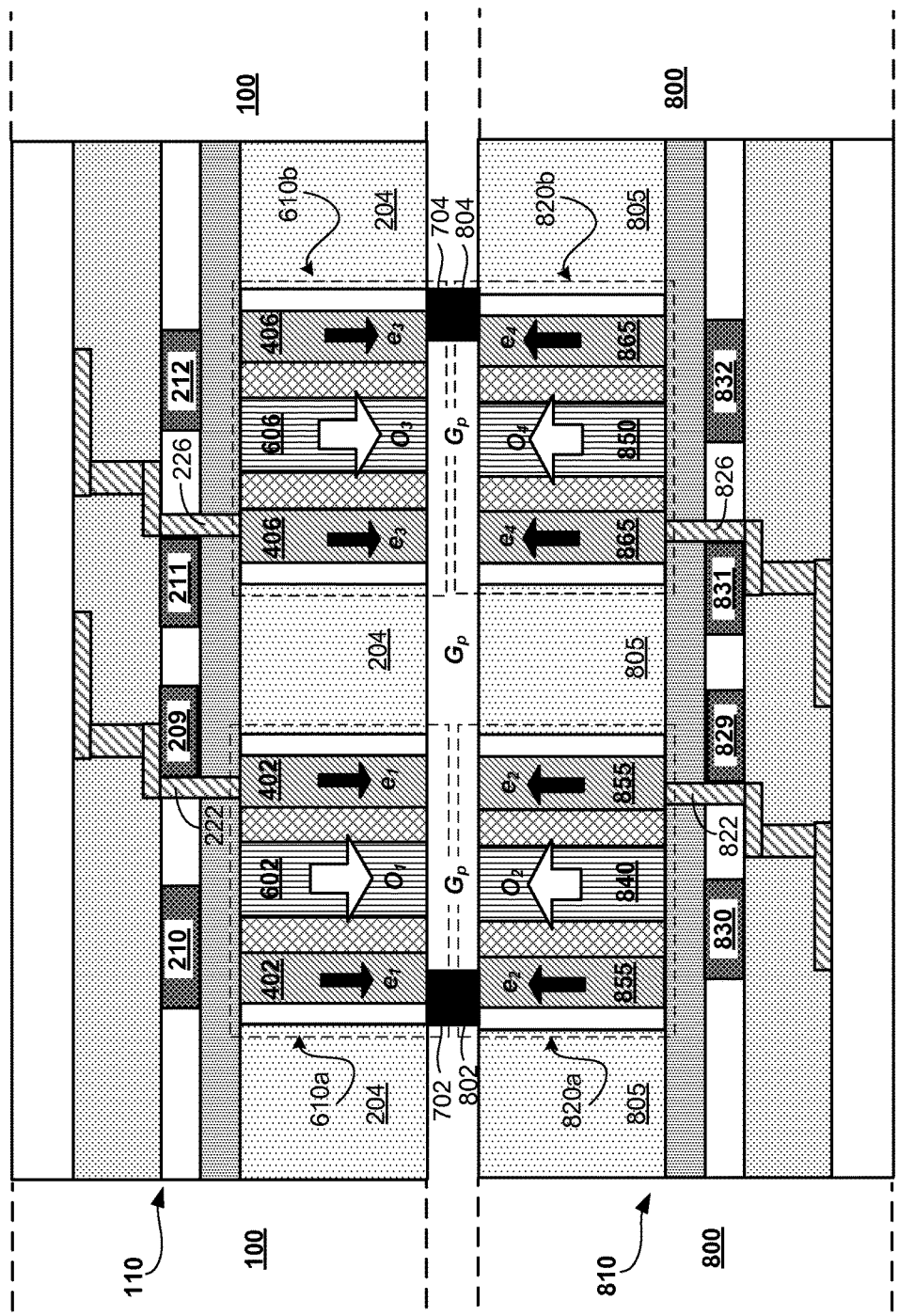
FIG. 8 illustrates a 3-D integration of two semiconductor devices using optical/electrical TSV structures, according to one exemplary embodiment.

FIG. 8 illustrates a 3-D integration of two semiconductor devices 100, 800 using optical/electrical TSV structures, according to one exemplary embodiment. Semiconductor device 100 may include a single semiconductor chip, while semiconductor device 800 may include another separate semiconductor chip. The TSV structures 610a, 610b of region 110 of semiconductor device 100 are identical to those described above in relation to FIGS. 1-7. It may also be appreciated that the structure of TSVs 820a and 820b within region 810 of semiconductor device 800 are substantially identical to the structure of TSVs 610a and 610b. TSV structures 610a and 610b may be formed within the substrate (i.e., etched substrate 204) of semiconductor device 100, while TSV structures 820a and 820b may be formed within another separate substrate (i.e., etched substrate 805) of semiconductor device 800.

As depicted, the TSV structures 610a, 610b of region 110 of semiconductor device 100 are coupled to the TSV structures 820a, 820b of region 810 of semiconductor device 800 using their respective electrical contacts 702, 704, 802, 804. More specifically, TSV structure 610a of region 110 is coupled to TSV structure 820a of region 810 using respective electrical contacts 702 and 802. Also, TSV structure 610b of region 110 is coupled to TSV structure 820b of region 810 using respective electrical contacts 704 and 804.

As depicted, the waveguide structures of the TSVs 610a, 610b, 820a, 820b associated with each of the semiconductor devices 100, 800 are substantially aligned. Accordingly, the TSV structure 610a of semiconductor device 100 is substantially aligned with the TSV structure 820a of semiconductor device 800. Thus, optical signals $O_1$ and $O_2$ are exchanged between the substantially aligned optical cores 602, 840 of TSV structures 610a and 820a. Also, the TSV structure 610b of semiconductor device 100 is substantially aligned with the TSV structure 820b of semiconductor device 800. Thus, optical signals $O_3$ and $O_4$ are exchanged between the substantially aligned optical cores 606, 850 of TSV structures 610b and 820b.

For example, transceiver 210 of semiconductor device 100 may transmit an optical signal $O_1$ to transceiver 830 of semiconductor device 800. Similarly, transceiver 212 of semiconductor device 100 may transmit an optical signal $O_3$ to transceiver 832 of semiconductor device 800. According to an alternative example, transceiver 830 of semiconductor device 800 may transmit an optical signal $O_2$ to transceiver 210 of semiconductor device 100. Similarly, transceiver 832 of semiconductor device 800 may transmit an optical signal $O_4$ to transceiver 212 of semiconductor device 100. As depicted, the optical signals $O_1$, $O_2$, $O_3$, $O_4$ may propagate through a gap $G_p$ between the semiconductor devices 100, 800. In some embodiments, the gap $G_p$ may include air. In other embodiments, however, the gap $G_p$ may include an index matching material for matching the refractive index of optical cores 602, 840, 606, and 850.

Moreover, electrical signals $e_1$ and $e_2$ are exchanged between the substantially aligned electrically conductive layers 402, 855 of TSV structures 610a and 820a using electrical contacts 702 and 802. Also, electrical signals $e_3$ and $e_4$ are exchanged between the substantially aligned electrically conductive layers 406, 865 of TSV structures 610b and 820b using electrical contacts 704 and 804. For example, an electrical signal $e_1$ output from transistor 209 of semiconductor device 100 may be transmitted to transistor 829 of semiconductor device 800 through via connection 222, electrically conductive layer 402 of TSV 610a, contacts 702 and 802, electrically conductive layer 855 of TSV 820a, and via connection 822. Similarly, an electrical signal $e_2$ output from transistor 829 of semiconductor device 800 may also be transmitted to transistor 209 of semiconductor device 100 through via connection 822, electrically conductive layer 855 of TSV 820a, contacts 802 and 702, electrically conductive layer 402 of TSV 610a, and via connection 222.

According to another example, an electrical signal $e_3$ output from transistor 211 of semiconductor device 100 may be transmitted to transistor 831 of semiconductor device 800 through via connection 226, electrically conductive layer 406 of TSV 610b, contacts 704 and 804, electrically conductive layer 865 of TSV 820b, and via connection 826. Similarly, an electrical signal $e_4$ output from transistor 831 of semiconductor device 800 may also be transmitted to transistor 211 of semiconductor device 100 through via connection 826, electrically conductive layer 865 of TSV 820b, contacts 804 and 704, electrically conductive layer 406 of TSV 610b, and via connection 226.

Figure 9:
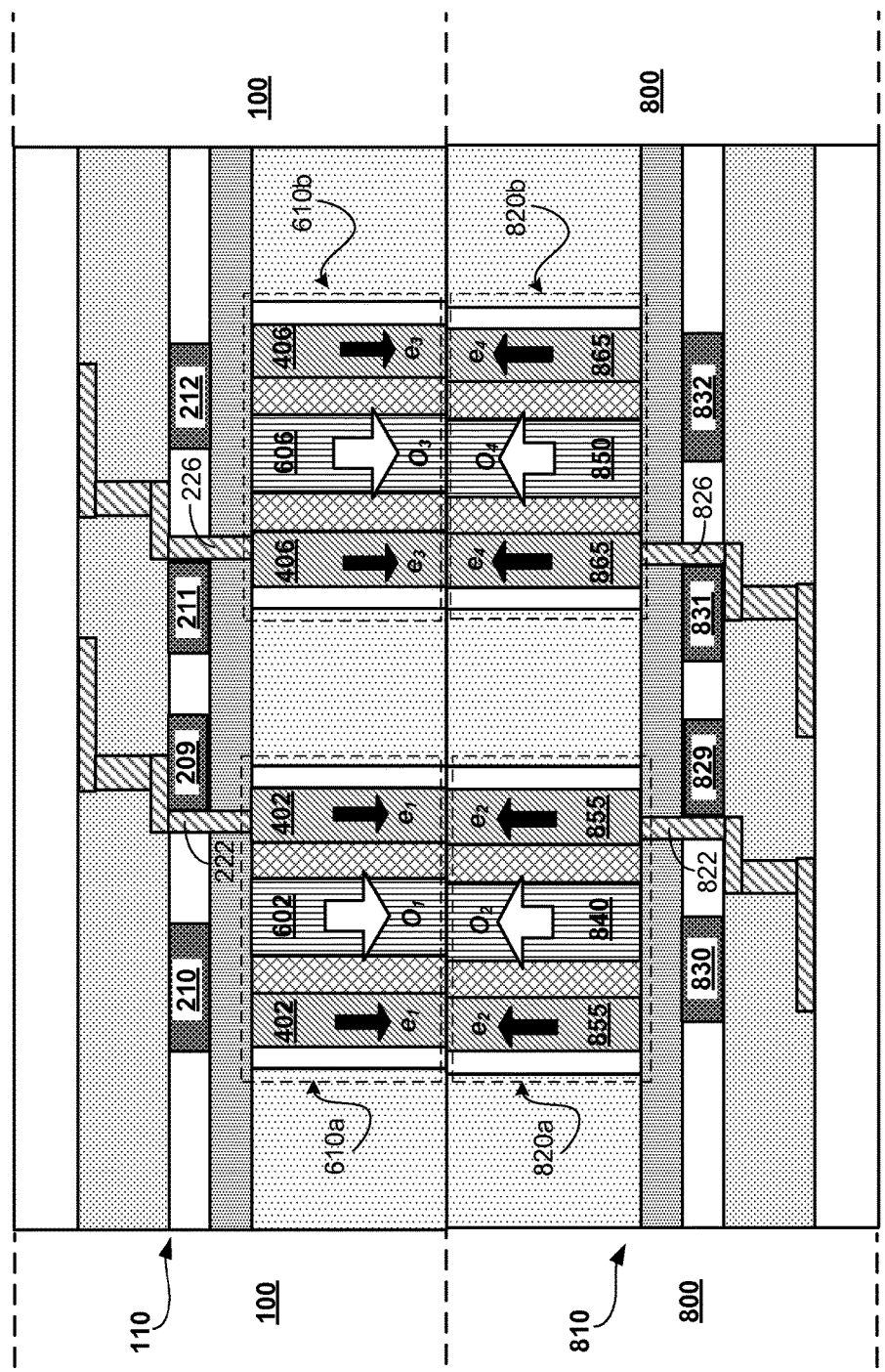
FIG. 9 illustrates a 3-D integration of two semiconductor devices using optical/electrical TSV structures, according to another exemplary embodiment.

FIG. 9 illustrates a 3-D integration of the two semiconductor devices of FIG. 8 by utilizing their optical/electrical TSV structures, according to another exemplary embodiment. As depicted, the TSV structures 610a, 610b of region 110 of semiconductor device 100 are directly coupled to the TSV structures 820a, 820b of region 810 of semiconductor device 800. More specifically, TSV structure 610a of region 110 is directly coupled to TSV structure 820a of region 810. Also, TSV structure 610b of region 110 is directly coupled to TSV structure 820b of region 810.

As depicted, the waveguide structures of the TSVs 610a, 610b, 820a, 820b associated with each of the semiconductor devices 100, 800 are substantially aligned and may be in contact. Accordingly, the TSV structure 610a of semiconductor device 100 is substantially aligned and in contact with the TSV structure 820a of semiconductor device 800. Thus, optical signals $O_1$ and $O_2$ are exchanged between the substantially aligned optical cores 602, 840 of TSV structures 610a and 820a. Also, the TSV structure 610b of semiconductor device 100 is substantially aligned and in contact with the TSV structure 820b of semiconductor device 800. Thus, optical signals $O_3$ and $O_4$ are exchanged between the substantially aligned optical cores 606, 850 of TSV structures 610b and 820b.

For example, transceiver 210 of semiconductor device 100 may transmit an optical signal $O_1$ to transceiver 830 of semiconductor device 800. Similarly, transceiver 212 of semiconductor device 100 may transmit an optical signal $O_3$ to transceiver 832 of semiconductor device 800. According to an alternative example, transceiver 830 of semiconductor device 800 may transmit an optical signal $O_2$ to transceiver 210 of semiconductor device 100. Similarly, transceiver 832 of semiconductor device 800 may transmit an optical signal $O_4$ to transceiver 212 of semiconductor device 100. As depicted, the optical signals $O_1$, $O_2$, $O_3$, $O_4$ may propagate directly (i.e., no gap) between the optical cores 602, 840, 606, 850 of the semiconductor devices 100, 800.

Moreover, electrical signals $e_1$ and $e_2$ are directly exchanged between the substantially aligned and coupled electrically conductive layers 402, 855 of TSV structures 610a and 820a without the use of electrical contacts 702, 802 (FIG. 8). Also, electrical signals $e_3$ and $e_4$ are exchanged between the substantially aligned and coupled electrically conductive layers 406, 865 of TSV structures 610b and 820b without the use of electrical contacts 704, 804 (FIG. 8). For example, an electrical signal $e_1$ output from transistor 209 of semiconductor device 100 may be transmitted to transistor 829 of semiconductor device 800 through via connection 222, electrically conductive layer 402 of TSV 610a, electrically conductive layer 855 of TSV 820a, and via connection 822. Similarly, an electrical signal $e_2$ output from transistor 829 of semiconductor device 800 may also be transmitted to transistor 209 of semiconductor device 100 through via connection 822, electrically conductive layer 855 of TSV 820a, electrically conductive layer 402 of TSV 610a, and via connection 222.

According to another example, an electrical signal $e_3$ output from transistor 211 of semiconductor device 100 may be transmitted to transistor 831 of semiconductor device 800 through via connection 226, electrically conductive layer 406 of TSV 610b, electrically conductive layer 865 of TSV 820b, and via connection 826. Similarly, an electrical signal $e_4$ output from transistor 831 of semiconductor device 800 may also be transmitted to transistor 211 of semiconductor device 100 through via connection 826, electrically conductive layer 865 of TSV 820b, electrically conductive layer 406 of TSV 610b, and via connection 226.

As depicted and described above, each TSV incorporates dual electrical and optical signal conducting capabilities through the formation of both an optical and an electrical waveguide within the same trench opening used to fabricate the TSV. This not only provides simultaneous optical and electrical signal transmission capabilities within each single TSV, but also facilitates the use of less real-estate associated with the semiconductor device. For example, TSV structure 610a (FIG. 7) formed within trench 106a (FIG. 1) may simultaneously conduct both optical signals $O_1$, $O_2$ (FIG. 8 or 9) and electrical signals $e_1$, $e_2$ (FIG. 8 or 9). Similarly, according to another example, TSV structure 610b (FIG. 7) formed within trench 106b (FIG. 1) may also simultaneously conduct both optical signals $O_3$, $O_4$ (FIG. 8 or 9) and electrical signals $e_3$, $e_4$ (FIG. 8 or 9). Electrically conductive layer 402 (FIG. 6) may include an outer core region of the TSV structure 610a (FIG. 6) that carries an electrical signal, while the first and the second dielectric layers 502, 602 (FIG. 6) include an inner core of the TSV 610a (FIG. 6) that additionally carries an optical signal. Similarly, electrically conductive layer 406 (FIG. 6) may include an outer core region of the TSV structure 610b (FIG. 6) that carries an electrical signal, while the first and the second dielectric layers 506, 606 (FIG. 6) include an inner core of the TSV 610b (FIG. 6) that additionally carries an optical signal.

Figure 10:
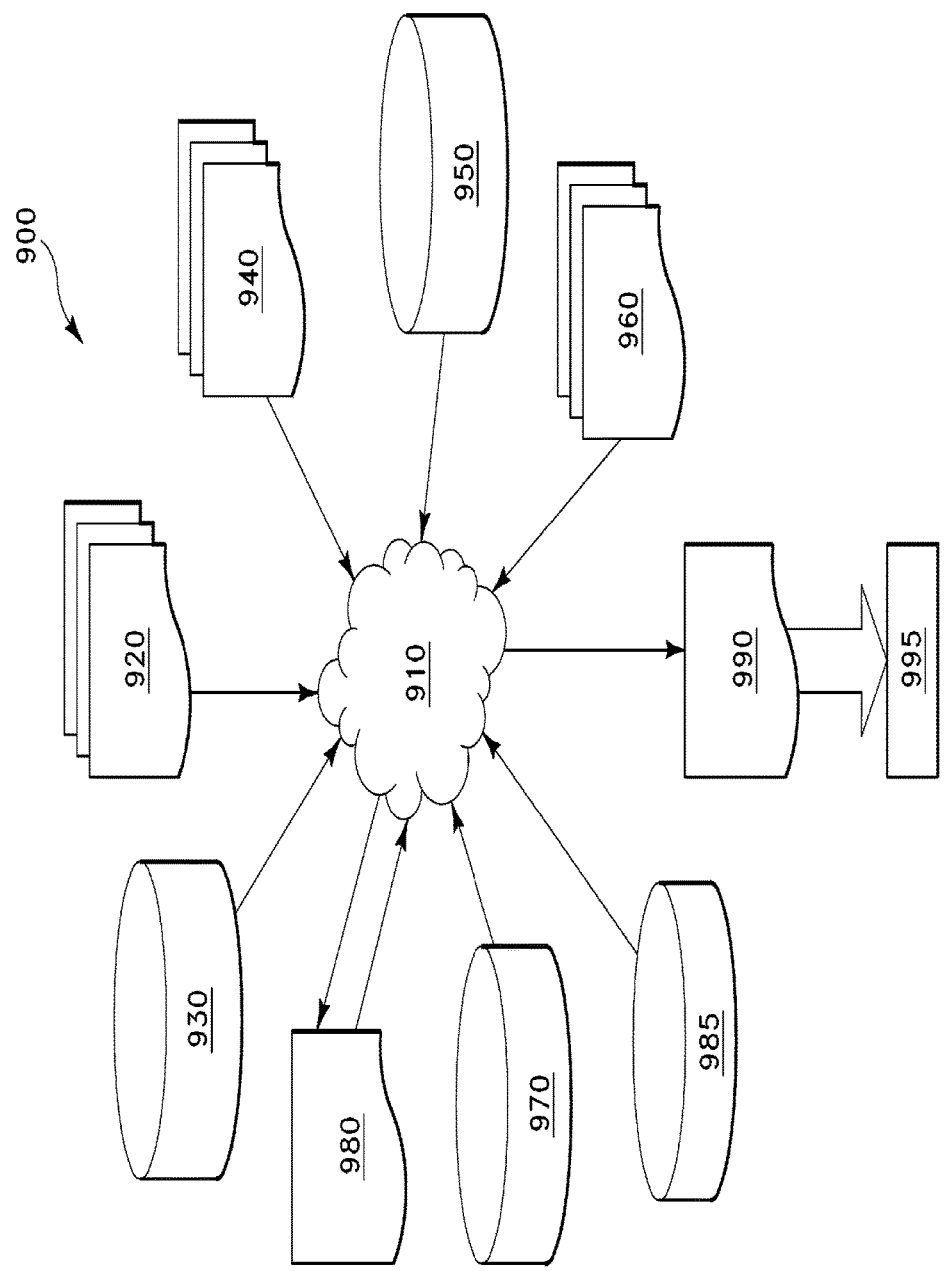
FIG. 10 is a flow diagram of a design process used in semiconductor design, manufacture, and/or test.

FIG. 10 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 7-9. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 7-9. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 7-9 to generate a Netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array.

The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 7-9. In one embodiment, design structure 990 may comprise a compiled, executable HDL simulation model that functionally simulates the devices shown in FIGS. 7-9.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 7-9. Design structure 990 may then proceed to a stage 995 where, for example, design structure 990: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A through-silicon-via (TSV) structure formed within a semiconductor device, the TSV structure comprising:
    a trench located within a substrate region of the semiconductor device;
    an insulator layer located on at least one side wall of the trench;
    an electrically conductive layer located on the insulator layer;
    a first dielectric layer located on the electrically conductive layer; and
    a second dielectric layer located on the first dielectric layer and filling the trench, the second dielectric layer having a higher refractive index relative to the first dielectric layer, the first and the second dielectric layer creating an optical waveguide structure, and the electrically conductive layer creating an electrical waveguide structure.

2. The structure of claim 1, wherein the electrically conductive layer includes an outer core of the TSV that carries an electrical signal, and wherein the first and the second dielectric layer include an inner core of the TSV that carries an optical signal.

3. The structure of claim 1, wherein the insulator layer comprises one of an oxide material having a thickness of about 0.1-1.0 micrometers (μm) and a nitride material having a thickness of about 0.1-1.0 micrometers (μm).

4. The structure of claim 1, wherein the electrically conductive layer comprises a copper material having a thickness of about 1-10 micrometers (μm).

5. The structure of claim 4, wherein the first dielectric layer comprises an oxide material having a thickness of about 1-2 micrometers (μm).

6. The structure of claim 5, wherein the second dielectric layer comprises a nitride material having a thickness of about 1-10 micrometers (μm).

7. The structure of claim 6, wherein the second dielectric layer and the first dielectric layer comprise a refractive index ratio of about 1.5-5.0.

8. The structure of claim 1, further comprising:
    an electrical contact located at an opening of the trench and in electrical contact with the electrically conductive layer.

9. The structure of claim 8, further comprising another semiconductor device including another TSV structure, the another TSV structure comprising:
    another trench located within the another substrate region of the another semiconductor device;
    another insulator layer located on at least one side wall of the another trench;
    another electrically conductive layer located on the another insulator layer;

another first dielectric layer located on the another electrically conductive layer; and another second dielectric layer located on the another first dielectric layer and filling the another trench, the another second dielectric layer having a higher refractive index relative to the another first dielectric layer, the another first and the another second dielectric layer creating another optical waveguide structure, and the another electrically conductive layer creating an electrical waveguide structure.

10. The structure of claim 9, further comprising:

another electrical contact located at an opening of the another trench and in electrical contact with the another electrically conductive layer, the electrical contact of the semiconductor device in electrical contact with the another electrical contact of the another semiconductor device to create a three-dimensional (3D) integration using the semiconductor device and the another semiconductor device, wherein the electrically conductive layer and the another electrically conductive layer provide electrical coupling between the semiconductor device and the another semiconductor device, and the optical waveguide structure and the another optical waveguide structure provide optical coupling between the semiconductor device and the another semiconductor device.

11. The structure of claim 9, wherein the another insulator layer comprises an oxide material having a thickness of about 0.1-1.0 micrometers (μm).

12. The structure of claim 9, wherein the another insulator layer comprises a nitride material having a thickness of about 0.1-1.0 micrometers (μm).

13. The structure of claim 9, wherein the another electrically conductive layer comprises a copper material having a thickness of about 1-10 micrometers (μm).

14. The structure of claim 13, wherein:

the another first dielectric layer comprises an oxide material having a thickness of about 1-2 micrometers (μm), and the another second dielectric layer comprises a nitride material having a thickness of about 1-10 micrometers (μm).

15. The structure of claim 14, wherein the another second dielectric layer and the another first dielectric layer comprise a refractive index ratio of about 1.5-5.0.

16. A method of forming a through-silicon-via (TSV) structure within a semiconductor device, the method comprising:

etching a trench within a substrate region of the semiconductor device;

depositing an insulator layer on at least one side wall of the trench;

depositing an electrically conductive layer on the insulator layer;

depositing a first dielectric layer on the electrically conductive layer; and depositing a second dielectric layer on the first dielectric layer and filling the trench, the deposited second dielectric layer having a higher refractive index relative to the deposited first dielectric layer, the deposited first and the deposited second dielectric layer forming an optical waveguide structure, and the deposited electrically conductive layer forming an electrical waveguide structure.

17. The method of claim 16, further comprising:

forming an electrical contact at the opening of the trench and in electrical contact with the deposited electrically conductive layer.

18. The method of claim 17, further comprising forming another through-silicon-via (TSV) structure within another semiconductor device, the forming of the another through-silicon-via (TSV) structure comprising:

etching another trench within a substrate region of the another semiconductor device;

depositing another insulator layer on at least one side wall of the another trench;

depositing another electrically conductive layer on the another insulator layer;

depositing another first dielectric layer on the another electrically conductive layer; and depositing a second dielectric layer on the first dielectric layer and filling the trench, the deposited another second dielectric layer having a higher refractive index relative to the deposited another first dielectric layer, the deposited first and the deposited second another dielectric layer creating another optical waveguide structure, wherein the another electrically conductive layer electrically couples the semiconductor device and the another semiconductor device, and wherein the optical waveguide structure optically couples the semiconductor device and the another semiconductor device.

19. The method of claim 18, further comprising:

forming another electrical contact at the opening of the another trench and in electrical contact with the another electrically conductive layer, the electrical contact of the semiconductor device in electrical contact with the another electrical contact of the another semiconductor device to form a three-dimensional (3D) integration using the semiconductor device and the another semiconductor device, wherein the electrically conductive layer and the another electrically conductive layer electrically couple the semiconductor device and the another semiconductor device, and the optical waveguide structure and the another optical waveguide structure optically couple the semiconductor device and the another semiconductor device.

20. A through-silicon-via (TSV) structure formed within a semiconductor device, the TSV structure comprising:

a trench located within a substrate region of the semiconductor device, the trench having a concentric axis;

an insulator layer located on a sidewall of the trench;

an electrical waveguide structure located on the insulator layer within an outer concentric region of the trench; and an optical waveguide structure located on the electrical waveguide structure within an inner concentric region of the trench, wherein the outer concentric region and the inner concentric region share the concentric axis of the trench.

* * * * *